United States Patent
Swanson et al.

(10) Patent No.: US 8,990,755 B2
(45) Date of Patent: Mar. 24, 2015

(54) DEFECTIVE ARTIFACT REMOVAL IN PHOTOLITHOGRAPHY MASKS CORRECTED FOR OPTICAL PROXIMITY

(75) Inventors: John A. Swanson, Forest Grove, OR (US); Stephan Wagner, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/977,481

(22) PCT Filed: Dec. 29, 2011

(86) PCT No.: PCT/US2011/067946
§ 371 (c)(1),
(2), (4) Date: Jun. 28, 2013

(87) PCT Pub. No.: WO2013/101115
PCT Pub. Date: Jul. 4, 2013

(65) Prior Publication Data
US 2014/0195994 A1    Jul. 10, 2014

(51) Int. Cl.
*G06F 17/50* (2006.01)
*G03F 1/36* (2012.01)
*G03F 1/72* (2012.01)

(52) U.S. Cl.
CPC .............. *G06F 17/5068* (2013.01); *G03F 1/36* (2013.01); *G03F 1/72* (2013.01)
USPC .............................. 716/124; 716/55; 716/119

(58) Field of Classification Search
USPC .......................................................... 716/55
See application file for complete search history.

(56) References Cited

U.S. PATENT DOCUMENTS

| 6,077,310 A * | 6/2000 | Yamamoto et al. ............. 716/53 |
| 7,603,648 B2 | 10/2009 | Liu et al. |
| 2007/0130559 A1 | 6/2007 | Torunoglu et al. |
| 2009/0113359 A1 | 4/2009 | Chew et al. |

FOREIGN PATENT DOCUMENTS

WO    WO 2006-007074    1/2006

OTHER PUBLICATIONS

PCT Search Report, PCT/US2011/067946, Intel Corporation, Jan. 21, 2013, 10 pages.

* cited by examiner

*Primary Examiner* — Paul Dinh
*Assistant Examiner* — Bryce Aisaka
(74) *Attorney, Agent, or Firm* — Blakely, Sokoloff, Taylor & Zafman LLP

(57) ABSTRACT

Defective artifact removal is described in photolithography masks corrected for optical proximity. In one example a method is described in which partitions are identified in a mask design for independent optimization. The partitions are grouped and ordering into stages. The first stage is processed. Geometries are extracted from the periphery of the first stage partitions. The extracted geometries are added to the peripheries of second stage partitions. Then the second stage partitions are processed.

17 Claims, 7 Drawing Sheets

DEFECTIVE ARTIFACT REMOVAL IN PHOTOLITHOGRAPHY MASKS CORRECTED FOR OPTICAL PROXIMITY

CROSS-REFERENCE TO RELATED APPLICATION

This patent application is a U.S. National Phase Application under 35 U.S.C. §371 of International Application No. PCT/US2011/067946, filed Dec. 29, 2011, entitled "DEFECTIVE ARTIFACT REMOVAL IN PHOTOLITHOGRAPHY MASKS CORRECTED FOR OPTICAL PROXIMITY".

TECHNICAL FIELD

The present description relates to photolithography technology, and in particular, to processing partitions of masks in stages for photolithography.

BACKGROUND

In semiconductor manufacturing, devices, such as transistors, are produced on a semiconductor wafer and interconnected to form integrated circuits (ICs). The wafer is cut up into individual dies that carry the ICs and then dies are then packaged and sold. Forming the devices typically includes numerous steps of photolithography that provide patterns on the wafer surface.

Photolithography starts with forming a photosensitive film on a wafer, exposing the film with a pattern by projecting radiation through a mask to chemically alter the film, and developing away exposed or unexposed portions of the film so a patterned film remains on the wafer. One or more masks are used to create the patterns in the film and the masks are designed and optimized using software tools.

The masks are designed based on the desired pattern and, in part, on the characteristics of the photolithography equipment, including the optics and the illumination source. The masks are designed using computer programs and to make increasingly smaller more complex circuit components a design can contain many layers both directly drawn and synthesized and hence numerous masks. Each layer is optimized through various compensation techniques. For critical layers one of the processes is commonly referred to as Optical Proximity Correction (OPC).

Depending on the objectives and complexity of the layers, the optimizations performed on the design can be computationally expensive and not viable to perform on a single computer. In order to save time and cost clusters of computers are used. The mask design is partitioned to break the layout into smaller pieces so that each partition can be processed, and distributed efficiently. Various partitioning schemes can be designed to tradeoff maximizing throughput or accuracy, for example by only considering artifacts along specific structure or partition boundaries. After each of the data partitions are distributed to different computing nodes, and modified, then the modified results are collected to be merged into a final output form. However, because each data partition is processed independently, possibly using an iterative or optimization type algorithm, there are mis-matches between the different partitions where they come together. There may also be artifacts along the partition border interfaces. These occur where each partition was processed without knowledge of the neighboring structures. The mismatches can be repaired manually, but this requires careful work and time.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Advanced layout processing techniques may be used to make modified layouts of one partition of a mask design visible during the processing of adjacent dependent partitions. The change in processing flow allows the mask geometry to be precisely aligned along the boundaries of adjacent partitions. This may eliminate subtle mis-processing artifacts and reduce the risks of mask defects.

A multi-pass hierarchical processing technique is used to optimize distributed workloads and to reduce overall mask layout processing times. Previously modified mask data is then re-used along the boundaries of adjacent partitions when processing subsequent partitions. The boundary information from previously processed partitions is passed to dependent partitions in a fully automated flow. In addition, geometric algorithms are able to "match" to the previously modified mask geometries along the partition boundaries.

Figure 1:
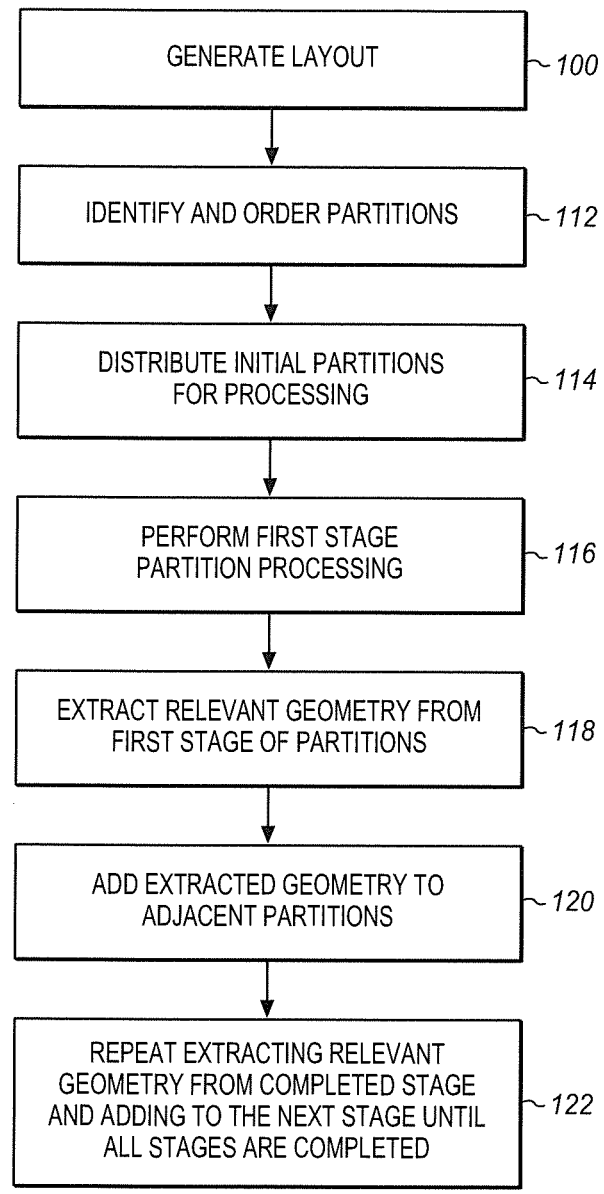
FIG. 1 is a process flow diagram of modifying a mask design according to an embodiment of the invention.

In one embodiment of the present invention, there are three components. These are shown in the context of an overall mask development processing flow in FIG. 1. First, a mask design and layout is generated. This may be done using any of a variety of different techniques. Typically, the electrical circuitry is designed and then automated tools are used to map the circuitry into an initial layout. Then various automated optimization and test techniques are used to improve the design and make it producible on a wafer. All of these operations are a part of block 110 of FIG. 1.

Figure 2A:
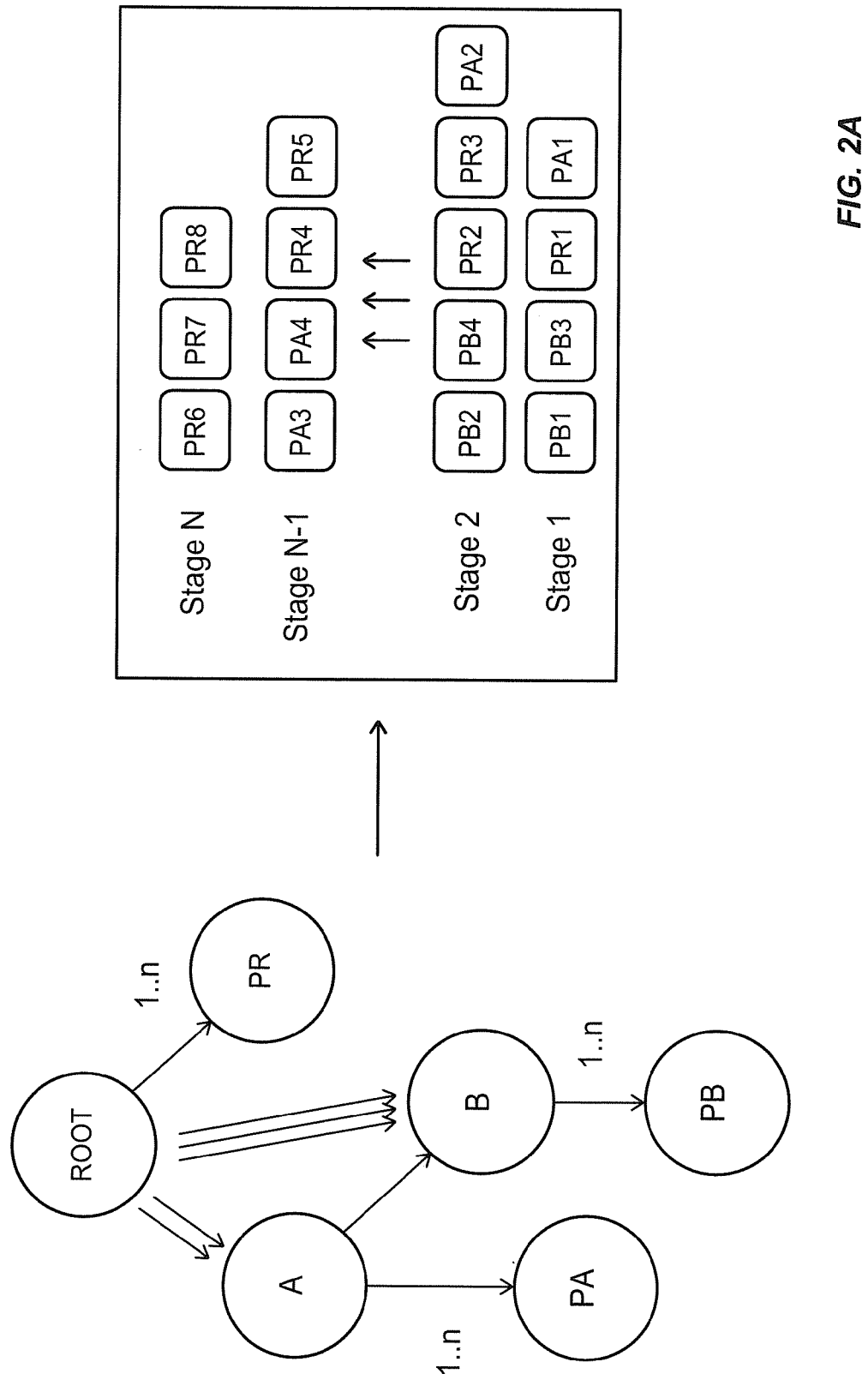
FIG. 2A is diagram of a directed a-cyclical graph according to an embodiment of the invention.

Next at block 112, the input design and layout is analyzed to identify partitions from which a directed a-cyclical graph (DAG) may be created. The partitions are portions of the design that may be optimized independently of each other. The DAG infers an initial ordering for partitioning processing to be extracted. Further internal and external dependencies at the structure and partition level are then identified resulting in a series of grouped stages for partition as shown in FIG. 2A. The DAG is used to capture initial hierarchical dependencies within the design layout. Alternatively, other partitioning schemes may be used instead.

The first stage of partitions in the DAG ordering is then distributed at block 114 to the many processing nodes for analysis. Due to the complexity of the processing, many different computers work on the mask design in parallel. Typically, a server farm is used to perform the processing. This allows the processing to be performed in hours instead of days. There are typically so many partitions that the partitions are ordered and the first stage is processed first, then a second stage and so on. At block 116, the initial processing is performed independently on each partition of the first stage.

This distributed processing includes OPC and may also encompass any type of modification that requires a context region. For purposes of the present disclosure the modifications of concern are those that might be impacted by correction in a neighboring partition. The distributed processes and optimizations are done in multiple stages. Within each stage the corrections are independent and done in a distributed parallel manner.

During partition processing, as the initial independent group of partitions are processed, at block 118 the completed partitions are examined and relevant geometry along the partition boundaries is extracted. The geometry may be extracted from either an in-memory or on-disk database containing the input geometries, i.e. the design geometries. The techniques described herein may be used as part of the same software engine that extracts the geometry. In one embodiment, all relevant geometries are identified that are contained within or that connect to the geometries in the specific partition to be processed.

The extracted geometries in the first stage are then added at block 120 to adjacent partitions before the adjacent partitions are processed. As a result, in subsequent stages of processing a partition contains not only the geometries internal to the partition but also the previously processed geometries located along the perimeter of the partition. The adjacent external geometry is then processed as if it is part of the partition. This cycle is repeated at block 122 until all of the partition processing has been completed.

When the second stage of partitions is submitted for processing, the processes are subjected to additional constraints that control how to handle the newly added external geometry. When previously processed geometry has been added to the periphery of the partition, the added constraints allow the geometry characteristics along the partitions periphery to be matched to the added external geometry.

Many different constraints may be considered. Of particular interest are those which affect the purpose of eliminating geometric artifacts by matching corrections across partitions. For example, "weak image" constraints and various mask making constraints, such as minimum jog length, minimum line end-to-end distances, etc may be considered. Using this approach, cross partition mismatches and induced artifacts may be reduced. This dramatically improves the quality of the resulting geometry for the mask.

An example of a directed a-cyclical graph is shown in FIG. 2A. The original design is the root R. From the root, three groups of partitions are identified. The first group is identified as Cell A and the second group as Cell B. The third group is the partitions of the root PR1 to PRN. Cell A and Cell B are independent and each generates respective partitions PA1 to PAN, and PB1 to PBN. The first stage processed contains independent partitions from all three cells (A, B and Root). These are shown as PB1, PB3, PR1, and PA1. The second stage also contains the next level of partitions that depend only on the partitions processed in the first stage. These are indicated as PB2, PB4, PR2, PR3, and PA2. The partitions for each cell may also be further ordered into additional stages.

Figure 2B:
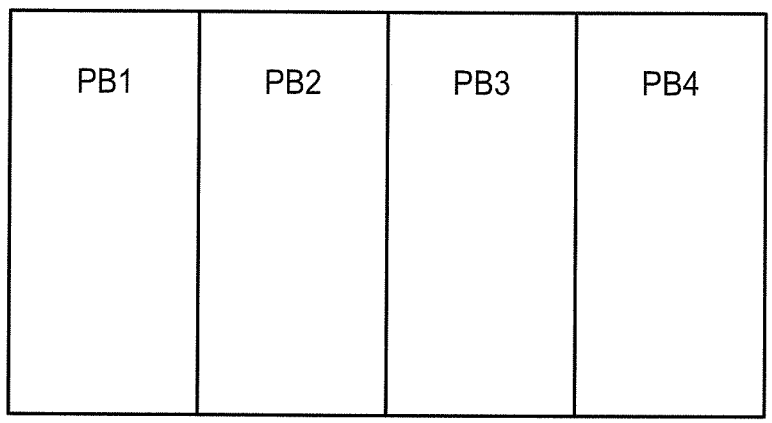
FIG. 2B is diagram of a portion of a partitioned photolithography mask design according to an embodiment of the invention.

FIG. 2B is a diagram of how a portion of the design may be partitioned in an actual theoretical design layout. In FIG. 2B, PB1, 2, 3, and 4 correspond to adjacent portion of the layout as shown above in FIG. 2A. These are all partitions of Cell B which break the Cell B structures into smaller pieces. As shown in FIG. 2A, adjacent partitions are assigned to different stages, so that PB1 and PB3 are in the first stage, while PB2 and PB4 are in the second stage. The first stage will be processed before the second stage and this is how the discontinuities in a feature across a partition boundary may be developed. The intersection and overlap of structures is determined by the DAG or other partitioning process and is indicated in FIG. 2A by the arrow pointing from Cell A to Cell B.

Figure 3:
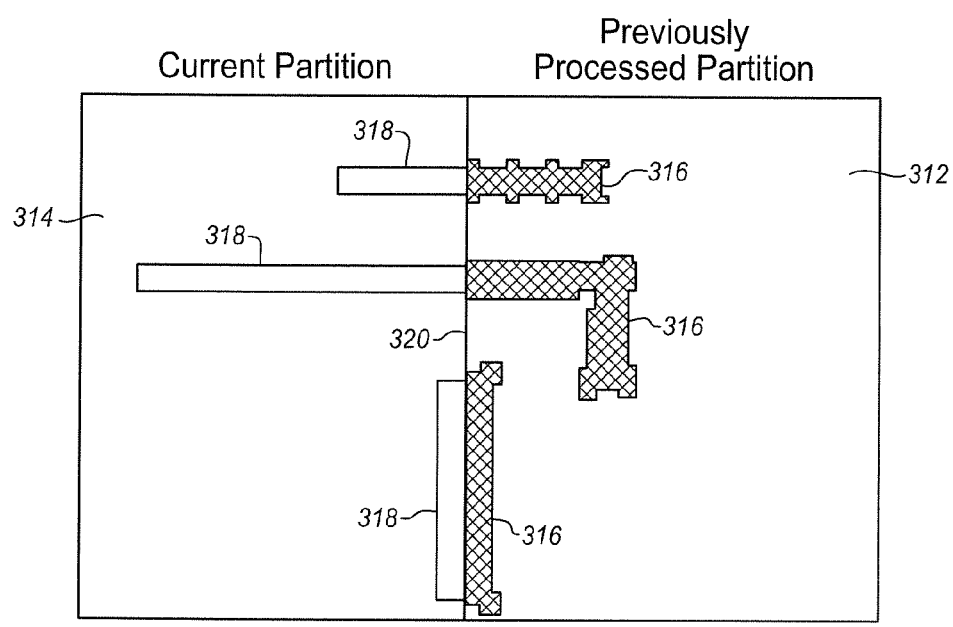
FIG. 3 is a diagram of two adjacent partitions of a mask design according to an embodiment of the invention.

FIG. 3 shows an example of two adjacent partitions. The partitions are simplified in order to make the diagram easier to understand. The partition 312 on the right side is part of an earlier stage and shows that the features 316 in the partition have been processed. The partition 314 on the left side of the diagram has features 318 that have not yet been processed. As shown, the features 318 of the unprocessed partition are simple, while the features 316 of the processed partition have been modified from the simple shapes. The modifications are typically to accommodate physical properties of the mask, the exposure equipment and the photoresist as well as to accommodate nearby structures, such as with optical proximity correction (OPC) and phase shift mask (PSM) technologies.

The peripheries of the two partitions are adjacent and share a common border. While the features may have lined up before processing, processed features 316 as shown do not match well with the unprocessed features 318. In the process described above in the context of FIG. 1, a portion of the processed geometries 316 from the earlier stage are added to the unprocessed features 318 of the partition of the subsequent stage.

Figure 4:
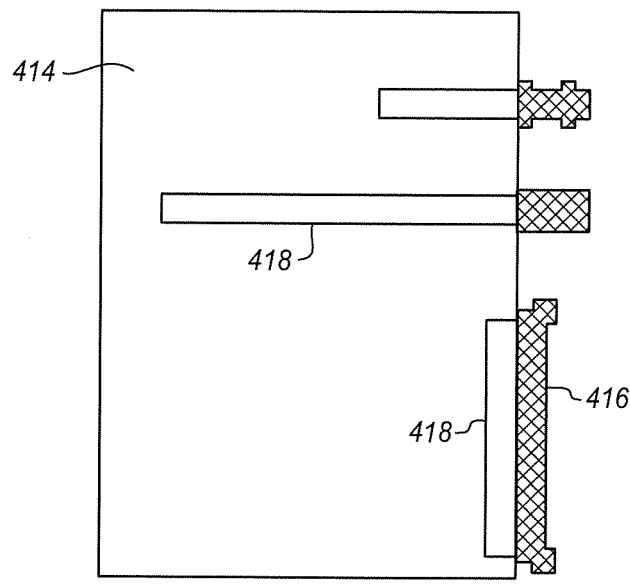
FIG. 4 is a diagram of the two adjacent partitions of FIG. 3 showing modification to the left side partition according to an embodiment of the invention.

FIG. 4 shows the modifications made to the left side partition of FIG. 3 before it is processed. The modified partition is identified as 414 and includes the same unmodified features 418 as in FIG. 3. The partition has been augmented by adding a portion of the features 416 from the previously processed partition. These features are taken from the previously processed partition and added to the periphery of the left side partition before processing.

Figure 5:
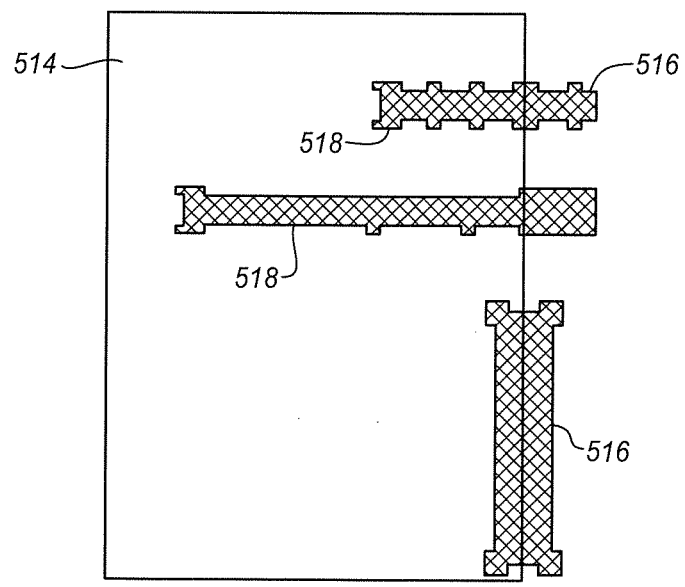
FIG. 5 is a diagram of the two adjacent partition of FIG. 4 after processing according to an embodiment of the invention.

FIG. 5 is a diagram of the same partition 514 after processing. The features of the partition 518 are modified for better results in actual photolithography and because of the inclusion of the external features 516, the features of the partition align with the features of the previously processed partition 312. It may occur that the features 516 of the earlier partition are modified during this process. The modifications may be ignored and the features of the original partition may be used or the process may be iterated to further refine the features through another cycle of processing.

Figure 6:
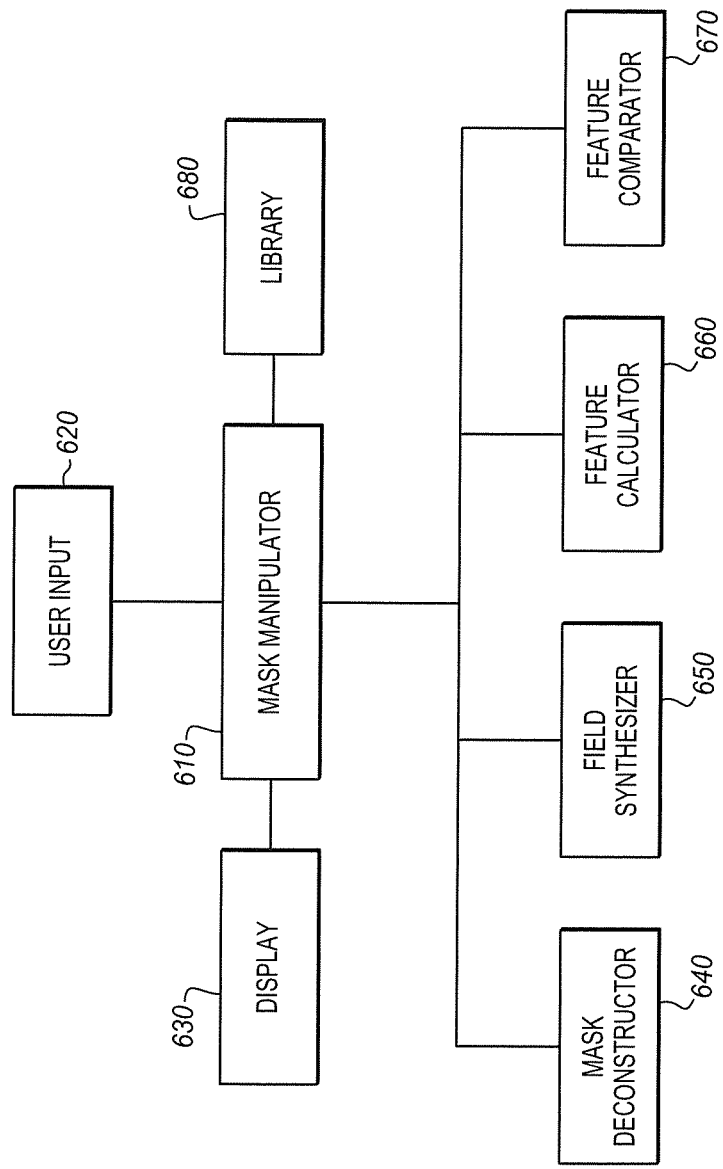
FIG. 6 is a block diagram of a system for modifying a mask design according to an embodiment of the invention.

FIG. 6 shows a system for creating a mask design according to an embodiment. A mask manipulator module 610 is coupled to a user input module 620, a display module 630, a mask deconstructor 640, an EM field synthesizer 650, a feature calculator 660, a feature comparator 670, and a library of corrections for primitives 680.

An initial mask is input into the mask manipulator 610 and the mask deconstructor 640 deconstructs the mask into its primitives (e.g., edges, edge-to-edge interactions, corners, etc.). The mask deconstructor may also divide the mask into partitions to be assigned to different computing nodes. The mask manipulator may represent all of the computing nodes that operate on a partition as a single entity 610.

The EM field synthesizer 650 looks up the correction for each primitive in the library of corrections 680 and then applies these corrections to an appropriate fast method. The resulting synthesized field corresponds to the field that would be calculated using a rigorous method. The feature calculator 660 uses the synthesized field to determine the features that would result from the application of the mask. The feature comparator 670 then compares these features with the desired features. The mask manipulator 610 changes the mask to reduce the discrepancy between the desired features and the synthesized features, and the resulting new mask is analyzed in the same way as described above.

The display 630 may show the synthesized field as well as the results of the comparison done by the feature comparator 670. If any user input is required, it may be given using the user input module 620. Various tasks may be performed manually or automatically. For example, the feature comparator 670 may perform its comparison automatically or with input from the user. A user may deconstruct a mask manually instead of allowing the mask deconstructor 640 to do so automatically. Similarly, the mask manipulator 610 may make changes to a mask completely automatically or with some user interaction. Other tasks may be performed with varying degrees of automation depending on the implementation.

Figure 7:
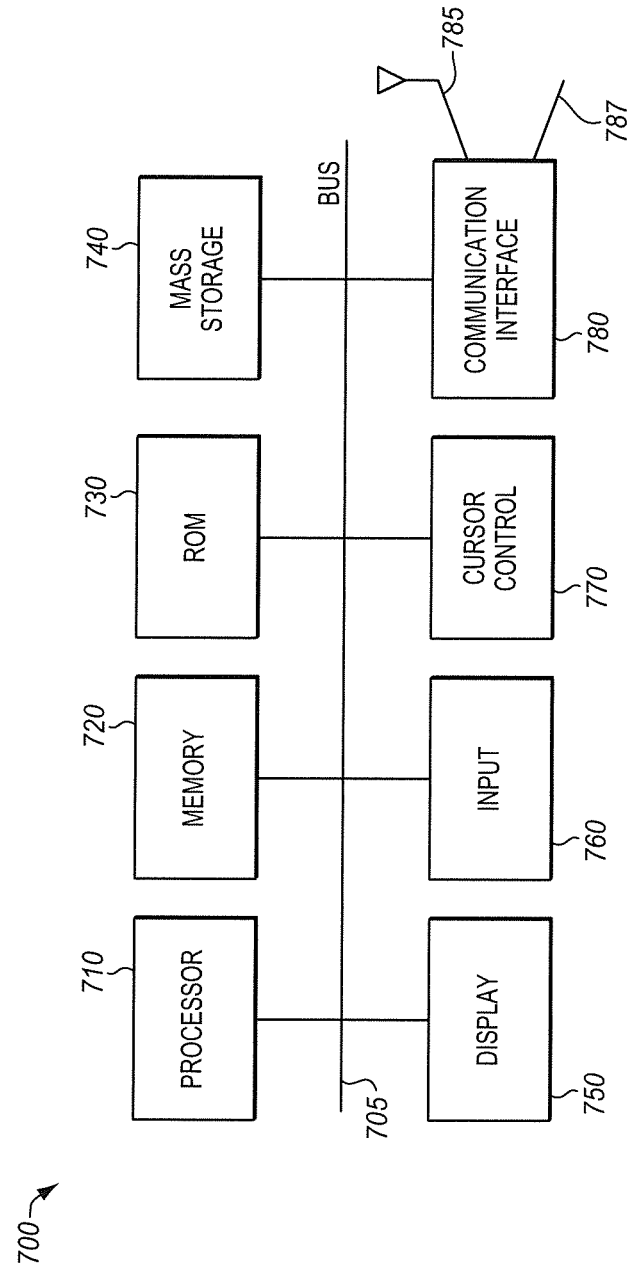
FIG. 7 is a block diagram of a computing system suitable for implementing embodiments of the invention.

FIG. 7 is a block diagram of one embodiment of an electronic system. The electronic system is intended to represent a range of electronic systems, for example, computer systems, network access devices, etc. Alternative systems, whether electronic or non-electronic, may include more, fewer, or different components. Systems such as that illustrated may be coupled together to provide multiple computing nodes as described above.

Electronic system 700 includes a bus 705 or other communications device to communicate information, and a processor 710 coupled to the bus 705 to process information. While the electronic system 700 is illustrated with a single processor, the electronic system 700 may include multiple processors or co-processors. The electronic system 700 further includes a random access memory (RAM) or other dynamic storage device 720 (referred to as memory), coupled to the bus 705 to store information and instructions to be executed by the processor 710. The memory 720 also may be used to store temporary variables or other intermediate information during execution of instructions by the processor 710.

The electronic system 700 also includes a read only memory (ROM) and/or other static storage device 730 coupled to bus 705 to store static information and instructions for the processor 710. A data storage device 740 is coupled to the bus 705 to store information and instructions.

The electronic system 700 may also be coupled via the bus 705 to a display device 750, such as a light emitting diode (LED) or liquid crystal display (LCD), to display information to a user. An input device 760, including alphanumeric and other keys, is typically coupled to the bus 705 to communicate information and command selections to the processor 710. Another type of user input device is a cursor control 770, such as a mouse, a trackball, or cursor direction keys to communicate direction information and command selections to the processor 710 and to control cursor movement on a display 750. The electronic system 700 further includes a network interface 780, such as a wired network interface 787 or a wireless network interface 785 to provide access to a network, such as a local area network.

Instructions are provided to memory from a storage device, such as magnetic disk, a read-only memory (ROM) integrated circuit, CD-ROM, DVD, via a remote connection (e.g., over a wired or wireless network via the network interface) providing access to one or more electronically-accessible media, etc. In alternative embodiments, hard-wired circuitry may be used in place of or in combination with software instructions. Thus, execution of sequences of instructions is not limited to any specific combination of hardware circuitry and software instructions.

A computer-readable medium includes any mechanism that provides (i.e., stores and/or transmits) content (e.g., computer executable instructions) in a form readable by an electronic device (e.g., a computer, a personal digital assistant, a cellular telephone). For example, a computer-readable medium may include read only memory (ROM); random access memory (RAM); magnetic disk storage media; optical storage media; or flash memory devices, etc.

Methods and apparatuses are described herein with respect to integrated circuit manufacturing; however, the techniques described may be applied to the manufacturing and/or design process of any integrated device. Integrated devices include integrated circuits, micromachines, thin film structures such as disk drive heads, gene chips, micro-electromechanical systems (MEMS), or any other article of manufacture that is manufactured using lithography techniques.

Reference throughout this specification to "one embodiment" or "an embodiment" means that a particular feature, structure, material, or characteristic described in connection with the embodiment is included in at least one embodiment of the invention. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

The above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

What is claimed is:

1. A method comprising:
    generating a photolithography mask design;
    identifying partitions in the design for independent optimization, wherein the partitions are optimized independently of each other;
    grouping the partitions and ordering each group of partitions into one stage of a sequence of multiple stages including a first stage and a second stage, each stage having more than one partition, the grouping and ordering comprising applying a directed a-cyclical graph to a root, the root comprising the mask design, and establishing cells within the root and partitions for the cells, the partitions being grouped, each cell corresponding to a different stage;
    processing a group of partitions ordered in the first stage independently of each other partition and without extracting geometries from other partitions using a computer;
    extracting geometries from the periphery of partitions in the first stage after processing;
    adding the extracted geometries to the peripheries of partitions of the second stage; and
    processing the partitions of the second stage, the partitions including the added extracted geometries using the computer.

2. The method of claim 1, wherein extracting geometries comprises:
    identifying a periphery of a partition of the first stage that is adjacent to the periphery of a partition of the second stage;

identifying geometries that are within a predetermined distance from the identified periphery;
extracting portions of the geometries that are within the predetermined distance from the identified periphery.

3. The method of claim 2, wherein identifying geometries comprises identifying geometries that connect to a geometry of the first stage partition.

4. The method of claim 2, wherein adding the extracted geometries comprises adding the extracted portions of the geometries as additional geometries to the second stage partition, the additional geometries being external to the periphery of the later stage partition.

5. The method of claim 4, wherein adding the extracted geometries comprises subjecting the geometries of the second stage partition to additional constraints during processing.

6. The method of claim 1, wherein processing comprises applying a mask optimization process to the partitions.

7. The method of claim 1, wherein processing the first stage comprises applying optical proximity correction to the first stage.

8. The method of claim 1, wherein grouping partitions comprises identifying internal and external dependencies at a structure and partition level using the directed a-cyclical graph.

9. The method of claim 8, wherein adjacent partitions are assigned to different stages.

10. The method of claim 8, wherein the partitions of a stage depend only on partitions processed in an earlier stage.

11. The method of claim 1, further comprising after processing the partitions of the second stage, iterating to further refine the features through another cycle of processing the first stage and then the second stage.

12. A non-transitory computer-readable medium having instructions that when executed by the computer cause the computer to perform operations comprising:
generating a photolithography mask design;
identifying partitions in the design for independent optimization, wherein the partitions are optimized independently of each other;
grouping the partitions and ordering each group of partitions into one stage of a sequence of multiple stages including a first stage and a second stage, each stage having more than one partition, the grouping and ordering comprising applying a directed a-cyclical graph to a root, the root comprising the mask design, and establishing cells within the root and partitions for the cells, the partitions being grouped, each cell corresponding to a different stage;
processing a group of partitions ordered in the first stage independently of each other partition and without extracting geometries from other partitions using a computer;
extracting geometries from the periphery of partitions in the first stage after processing by identifying a periphery of a partition of the first stage that is adjacent to the periphery of a partition of the second stage, identifying geometries that are within a predetermined distance from the identified periphery, and extracting portions of the geometries that are within the predetermined distance from the identified periphery;
adding the extracted geometries to the peripheries of partitions of the second stage; and
processing the partitions of the second stage, the partitions including the added extracted geometries using the computer.

13. The medium of claim 12, wherein the operation of identifying geometries comprises identifying geometries that connect to a geometry of the first stage partition.

14. The medium of claim 12, wherein the operation of processing comprises applying a mask optimization process to the partitions.

15. An apparatus comprising:
a mask deconstructor to identify partitions in a photolithography mask design for independent optimization, wherein the partitions are optimized independently of each other, to group the partitions and order each group into one stage of a sequence of multiple stages including a first stage and a second stage, each stage having more than one partition, the grouping and ordering comprising applying a directed a-cyclical graph to a root, the root comprising the mask design, and establishing cells within the root and partitions for the cells, the partitions being grouped, each cell corresponding to a different stage;
a mask manipulator to process a group of partitions ordered in the first stage independently of each other partition and without extracting geometries from other partitions;
the mask deconstructor further to extract geometries from the periphery of partitions in the first stage after processing, and add the extracted geometries to the peripheries of partitions of the second stage; and
the mask manipulator further to process the partitions of the second stage, the partitions including the added extracted geometries.

16. The apparatus of claim 15, wherein the mask manipulator comprises a feature calculator to add the extracted geometries by adding the extracted portions of the geometries as additional geometries to the second stage partition, the additional geometries being external to the periphery of the later stage partition.

17. The apparatus of claim 16, wherein adding the extracted geometries comprises subjecting the geometries of the second stage partition to additional constraints during processing.

* * * * *